United States Patent [19]

Tench

[11] Patent Number: 5,206,102

[45] Date of Patent: Apr. 27, 1993

[54] PHOTOELECTROCHEMICAL IMAGING SYSTEM

[75] Inventor: D. Morgan Tench, Ventura, Calif.

[73] Assignee: Rockwell International Corporation, Seal Beach, Calif.

[21] Appl. No.: 793,040

[22] Filed: Nov. 15, 1991

[51] Int. Cl.$^5$ .................. G03G 17/00; G03G 13/26
[52] U.S. Cl. ............................... 430/49; 430/945; 101/456; 101/467
[58] Field of Search ............... 430/49, 945; 101/456, 101/467

[56] References Cited

U.S. PATENT DOCUMENTS

| | | | |
|---|---|---|---|
| 4,204,865 | 5/1980 | Kuehnle et al. | 430/30 |
| 4,504,126 | 3/1985 | Thomas et al. | 350/469 |
| 4,814,259 | 3/1989 | Newman et al. | 430/945 |
| 4,872,962 | 10/1989 | Scheer et al. | 204/224 R |
| 4,959,668 | 9/1990 | Hirt | 346/155 |
| 5,006,387 | 4/1991 | Takao et al. | 430/945 |

Primary Examiner—John Goodrow
Attorney, Agent, or Firm—John C. McFarren

[57] ABSTRACT

A method and apparatus are provided for photoelectrochemical reproduction of an image on a plate or roller. For a printing press, the apparatus includes a reusable image roller coated with a oxide semiconductor. A plating solution is applied to the image roller as a thin film. The desired image is written onto the oxide semiconductor by a laser that generates a photoelectrochemical reaction between the semiconductor and the plating solution. In a preferred embodiment, the image roller is coated with hydrophilic p-type NiO. The image is written onto the roller as dots of oleophilic metallic copper, which are formed on the NiO coating by laser-generated cathodic photoelectrodeposition. Subsequent erasure of the metallic copper image can be accomplished by chemical or electrochemical dissolution of the deposited copper. The method functions to create, erase, and recreate high-resolution images directly on a printing press roller without the necessity of precise matrix registration.

15 Claims, 1 Drawing Sheet

PHOTOELECTROCHEMICAL IMAGING SYSTEM

TECHNICAL FIELD

The present invention relates to printing processes and, in particular, to a method and apparatus for writing and subsequently erasing high-resolution images directly on a reusable plate or image roller of a printing press.

BACKGROUND OF THE INVENTION

In the printing industry, lithography is a well-known technique for processing image plates to reproduce an image in the form of oleophilic areas on a hydrophilic surface. When inked with oil-based inks, the oleophilic image areas of the image plate attract ink while the hydrophilic background areas repel ink. The inked image can then be transferred to paper or another permanent medium. In offset lithography, a common method of printing, the printing press image plates are generally attached to rotating drums. Ink on the oleophilic image areas of the image plates is then transferred by contact to a rotating print roller comprising a metal drum or a rubber blanket. Paper carried by a rotating impression roller picks up the inked image as the paper is pressed between the print roller and the impression roller. Using a continuous roll of paper, many thousands of impressions can be made as the paper is fed between the rotating rollers and the image plates are continually re-inked.

Printing press image plates of conventional design are expensive to manufacture, require many process steps for transferring images to the plates, and must be changed to print new images. Because the printing industry loses considerable time and money in changing image plates on printing presses, there has been a long-felt need for an on-press imaging system in which oleophilic image areas can be written rapidly and accurately on erasable, reusable image rollers.

SUMMARY OF THE INVENTION

The present invention comprises a method and apparatus for photoelectrochemical reproduction of an image on a plate or a roller. For on-press imaging, the apparatus includes a reusable printing press image roller that comprises a rotatable drum coated with a hydrophilic oxide semiconductor. A plating solution is applied to the image roller, and the desired image is written onto the oxide semiconductor by action of a laser that generates a photoelectrochemical reaction between the semiconductor material and the plating solution. In one embodiment, the oxide semiconductor comprises p-type NiO, and dots of oleophilic metallic copper (Cu) are deposited on the surface of the NiO by cathodic photoelectrodeposition. In this embodiment, subsequent erasure of the metallic copper image can be accomplished by chemical or electrochemical dissolution of the deposited copper. In another embodiment, the oxide semiconductor comprises n-type $TiO_2$. For n-type $TiO_2$, dots of an oleophilic conducting polymer can be deposited by anodic photoelectrodeposition, or donut-shaped spots of metal can be deposited by cathodic reaction in the dark areas surrounding the laser illuminated dots. Although the imaging process of the present invention is electrochemical in nature, the semiconductor voltage bias resulting from redox processes in the plating solution may be sufficient for effective charge separation in some embodiments to make external electrical connections unnecessary.

A principal object of the invention is to provide a printing press system having on-press imaging capability. A feature of the invention is the combination of a reusable image roller coated with a hydrophilic oxide semiconductor, a plating solution applied to the image roller as a thin film, and a laser for writing a desired oleophilic image onto the image roller by photoelectrodeposition. An advantage of the invention is the ability to rapidly create, erase, and recreate high-resolution images directly on a printing press roller without the necessity of precise matrix registration, thereby saving time and money in the printing industry.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
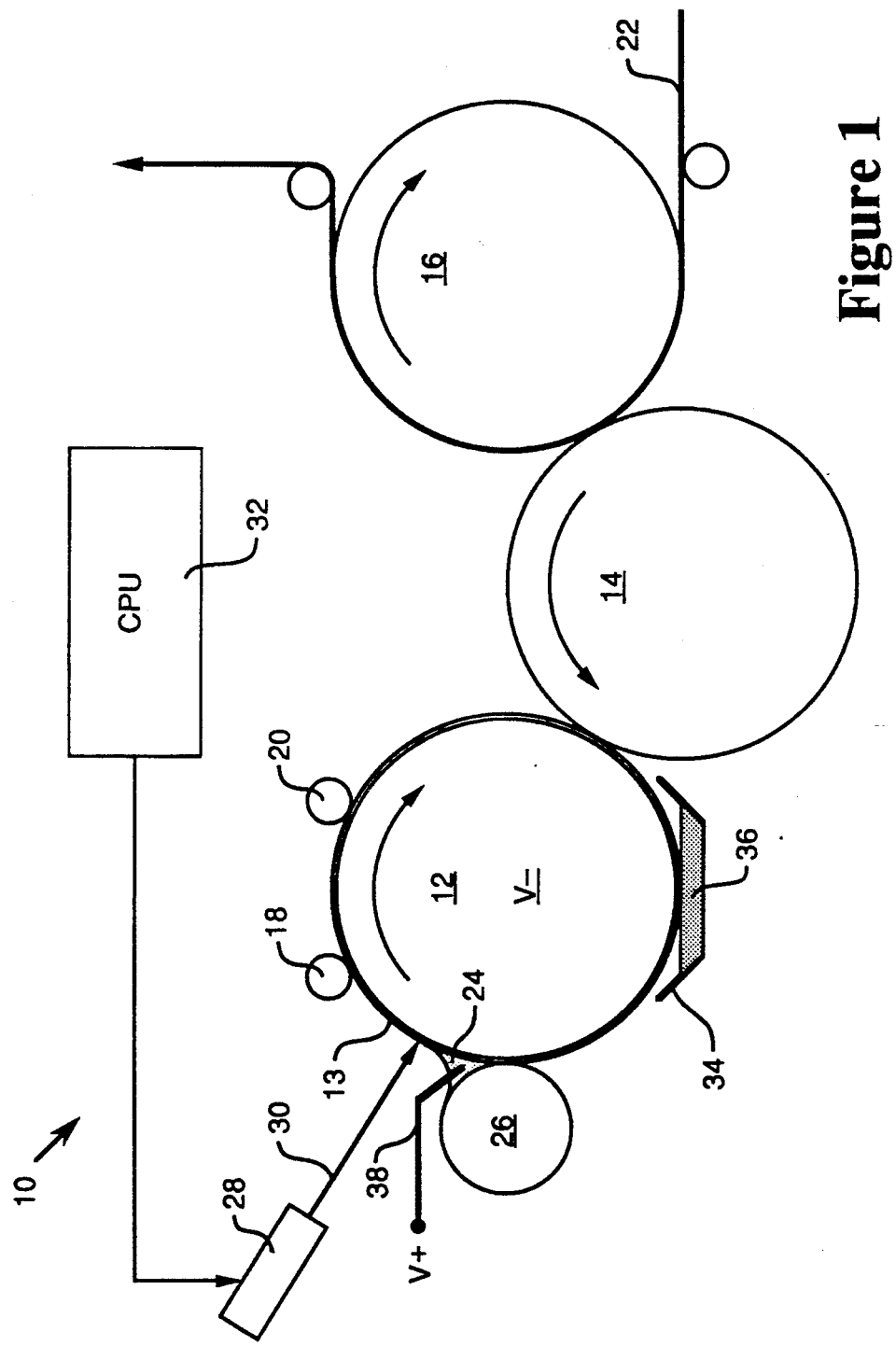
FIG. 1 is a schematic illustration of an offset printing press that incorporates a photoelectrochemical on-press imaging system of the present invention.

The present invention comprises a method and apparatus for reproducing an image on an image plate or roller. FIG. 1 is a schematic illustration of an offset printing press that incorporates a photoelectrochemical on-press imaging system 10 of the present invention for reproducing an image on a roller. System 10 includes an image roller 12, a print roller 14, and an impression roller 16, each of which rotates in a direction indicated by its respective arrow. During printing operations, image roller 12 is dampened by a dampener roller 18 that wets the hydrophilic areas of image roller 12. After the hydrophilic areas have been dampened, an ink roller 20 applies ink to the hydrophobic image areas written onto roller 12. As roller 12 rotates, the inked image is transferred to print roller 14, which prints the image onto paper 22 that is transported and pressed against print roller 14 by impression roller 16.

Image roller 12 of the present invention comprises a rotatable drum having a surface coating 13 comprising a hydrophilic oxide semiconductor material. During the process of writing an image onto roller 12, a plating solution 24 is applied as a thin film to hydrophilic coating 13 as roller 12 rotates. Application of solution 24 may be accomplished by an auxiliary roller 26, for example. A laser 28 projects a writing beam 30 through the film of plating solution 24 and onto coating 13. Laser 28 is controlled by a computer processor (CPU) 32, which commands laser 28 to scan beam 30 across roller 12 to write a predetermined image onto coating 13. The predetermined image may comprise text and graphics, for example, and may be provided to CPU 32 by a word processor (not shown), as is well known in the art. Typically, the image is written onto coating 13 as a multiplicity of dots of oleophilic (and hydrophobic) material deposited from solution 24 onto hydrophilic coating 13. After the desired image is written onto coating 13, plating solution 24 can be removed from roller 12 for commencement of normal printing operations as described above. When a new image is desired, a bath 34 containing a solvent or electrolyte 36 may be moved into place to dissolve the dots of oleophilic material deposited on coating 13. Dissolution of the image dots may be accomplished by chemical action using an acid, for example, or by electrochemical action using a suitable electrolyte and associated electrical bias. After the old dots of oleophilic material have been removed from hydrophilic coating 13, a new image may be written onto coating 13 using laser beam 30 and the method described above.

In the preferred embodiment of the present invention, hydrophilic coating 13 on image roller 12 comprises nickel oxide (NiO), which is a p-type semiconductor material. Nickel oxide is highly resistant to attack by acid solutions. The image can be written directly on NiO coating 13 and erased repetitively using an acid solution or an electrochemical process. The substrate on roller 12 under NiO coating 13 may comprise metallic nickel (Ni), which provides good adhesion and readily passivates to render NiO coating 13 self-healing. NiO coating 13 may be applied by methods such as thermal oxidation of Ni metal, electrochemical deposition/passivation (followed by thermal dehydration), vacuum deposition (e.g., magnetron sputtering), chemical vapor deposition, or sol-gel deposition. Sol-gel deposition is a preferred method because it is a relatively low-temperature process and it facilitates adjustment of the charge carrier concentration in NiO coating 13 by means of $Li^+$ incorporation or variation in NiO stoichiometry. The best photoresponse of coating 13 has been attained using an NiO sol-gel process with a $Li^+$-doped underlayer (approximately 5 cation %), which provides a low resistance contact between the Ni substrate and the photoactive NiO overlayer. The photoresponse may be extended to longer wavelengths (lower energy) by utilizing a mixed metal oxide for the photoactive layer, or by using a narrower bandgap semiconductor layer under a wider bandgap material (which provides greater chemical stability).

Plating solution 24 may comprise a copper pyrophosphate electrolyte, for example. Although an externally applied electrical bias is not necessary in all embodiments of the invention, image drum 12 and coating 13 are usually biased negatively to V— as shown in FIG. 1. The action of laser beam 30 passing through the film of solution 24 on NiO coating 13 causes dots of Cu to be deposited on the surface of p-NiO coating 13 by the process of cathodic photoelectrodeposition. Laser beam 30 generates electron-hole pairs in semiconductor coating 13, a space charge field separates the charge, and the electrons reduce the $Cu^{2+}$ ions in solution 24 to metallic copper. The photoelectrochemical reaction may be summarized as follows:

$$Photons + p-NiO = h^+ + e^-$$

$$Cu^{2+} + 2e^- = Cu$$

Copper pyrophosphate electrolyte is a preferred plating solution 24 because it is energetically favorable, it is environmentally benign with low corrosivity at pH 8.3, and it yields high quality Cu deposits without organic additives. Other copper plating electrolytes may be used, including acid copper sulfate, copper cyanide, and any of various electroless copper plating baths. Electroless copper plating baths (i.e., without externally applied electrical bias) permit copper deposition to proceed spontaneously after illumination. Electrolytes containing copper salts not normally employed for electrodeposition may also be used. Because the process of the present invention involves a symmetrical, relatively smooth plating surface, good throwing power of the electrolyte (i.e., to plate irregular surfaces) is not a consideration. To enhance the efficiency and/or speed of the image writing process, a thin layer of material (typically oleophilic) can be deposited using illumination and then thickened and/or rendered oleophilic by further electro- or electroless deposition without continued illumination.

Laser light is known to induce deposition of metals, including Cu, by either localized heating or by photogeneration of electrons at semiconductor electrodes. Thermal deposition is less attractive for on-press imaging applications because it is relatively inefficient and slow. Photoelectrochemical deposition of metals on a coating of titanium dioxide has also been investigated as a means of preparing catalytic materials. Titanium dioxide is an n-type semiconductor, however, with the result that metal deposition occurs in the dark areas surrounding the laser beam spot. This deposits donut-shaped "dots" of metal that provide diminished resolution. Therefore, a p-type semiconductor oxide, such as NiO, is favored for its direct-write characteristics and superior dot definition.

Although the deposition of metal dots is an electrochemical process, the anodic reaction is also expected to occur on the non-illuminated areas of the semiconductor coating 13. In some embodiments of the invention, the inherent voltage difference (i.e., band bending) derived from equilibrium of the oxide coating with the plating electrolyte may be sufficient to provide effective separation of photogenerated charge carriers. Therefore, an external electrode may not be required in these cases. However, a counter electrode 38 (comprising platinum or copper, for example) is generally immersed in electrolyte 24 for applying a positive voltage bias V+. Photocurrents in the $mA/cm^2$ range are preferred for providing uniform, fine-grain metal deposits and for enabling high speed imaging. For good laser light utilization, the NiO space charge thickness should be matched to the light absorption depth; there should be a low charge carrier recombination rate (i.e., low defect density); and there should be a low-resistance back contact between NiO coating 13 and the supporting substrate. After the image has been written and used in the printing process, electrolyte 24 and electrode 38 may be employed (as an alternative or adjunct to bath 34) to effect electrochemical dissolution of the Cu deposits (i.e., to erase the image) by reversing the electrical bias from that illustrated in FIG. 1.

As mentioned above, NiO coating 13 may be applied to the substrate material of roller 12 using a sol-gel process. This process involves hydrolysis of Ni acetate (as a starting material) dissolved in 2-methoxyethanol to form a nickel hydroxide sol (i.e., a colloidal dispersion of $Ni(OH)_2$). The sol is then applied to the substrate by spin coating, spraying, or slow withdrawal. Heat is applied to effect condensation of the $Ni(OH)_2$ to NiO (and to drive off water and excess solvent). Lithium doping may be used to improve the back ohmic contact between NiO coating 13 and the substrate material of roller 12. The hydrolysis and condensation steps of the sol-gel process can be summarized as follows:

$$CH_3-C-O-Ni-O-C-CH_3 + 2 H_2O = HO-Ni-OH + 2 CH_3-C-OH$$

$$n(HO-Ni-OH) = n(Ni-O) + n(H_2O)$$

In one experiment using the sol-gel process of the present invention, 4 coats of NiO, each 0.2 $\mu$m thick, were applied to form a 0.8 $\mu$m thick NiO film over a 0.2 $\mu$m thick coating of lithium-doped (5 cation %) NiO on a finely polished Ni substrate. Each coat was applied by refluxing (6 minutes) a mixture of 1.0 g Ni acetate tetrahydrate and 2.5 g 2-methoxyethanol; diluting the sol obtained with 3.6 ml of methanol; spin coating at 2700 rpm for 30 seconds; air drying for 30 minutes; and heating in air at 650° C. for 10 hours. To produce the Li-doped underlayer, 22 mg of Li acetate dihydrate was dissolved in the methanol used for dilution of the sol. After coating, about 0.5 cm$^2$ of the film-coated area was masked off with epoxy resin, immersed in a standard copper pyrophosphate plating bath (without organic additives), biased at $-0.5$ V versus a saturated calomel electrode (SCE), and partially illuminated (0.1 cm$^2$ circular area) for 5 minutes with light of 351 nm wavelength from a 100 mJ Xe:F excimer laser. Since the pulse duration was 10 nanoseconds and the pulse rate was 20 Hz, the total illumination time was 60 microseconds. Within the illuminated area, a thin film of Cu metal was visibly evident. Upon further exposure to the plating bath at $-0.5$ V for 60 minutes (without additional illumination), the Cu film grew in thickness, becoming distinctly copper-colored. The surrounding NiO that had not been illuminated by the laser remained unchanged. When the voltage bias was altered to $-0.17$ V versus SCE, the Cu deposit dissolved, leaving the surface of the NiO film apparently unaffected. Although the process steps and conditions were not optimized for this experiment, the results serve to illustrate the efficacy of the method and apparatus of the present invention.

Although the present invention has been described with respect to specific embodiments thereof, various changes and modifications can be carried out by those skilled in the art without departing from the scope of the invention. For example, the semiconductor coating may comprise an oleophilic material and the photoelectrodeposited image pattern may comprise a hydrophilic material. Therefore, it is intended that the present invention encompass such changes and modifications as fall within the scope of the appended claims.

I claim:

1. A method of reproducing an image on a printing plate, comprising the steps of:
   providing a surface layer of hydrophilic semiconductor material on the plate;
   applying a film of a metal plating solution on said surface layer of semiconductor material;
   illuminating selected areas of said surface layer of semiconductor material through said film of plating solution; and
   photoelectrochemically depositing a layer of oleophilic metal plating material on said illuminated areas of said surface layer of semiconductor material to form the image.

2. The method of claim 1, wherein the step of providing a layer of semiconductor material comprises providing a printing press image roller with said surface layer of semiconductor material.

3. The method of claim 2, wherein the steps of providing, applying, and depositing comprise providing said printing press image roller with a surface layer of hydrophilic p-type NiO, applying a film of a copper pyrophosphate electrolyte on said NiO surface, and photoelectrochemically depositing a layer of oleophilic copper on said NiO surface in the form of the image.

4. The method of claim 1, further comprising the step of removing said deposited layer of oleophilic metal plating material and thereby erasing the image from said surface layer of semiconductor material.

5. The method of claim 4, wherein the step of removing said deposited layer of oleophilic metal plating material comprises chemically or electrochemically dissolving said layer of oleophilic metal plating material without dissolving said surface layer of semiconductor material.

6. A method of on-press imaging, comprising the steps of:
   providing a printing press with an image roller having a surface of hydrophilic semiconductor material;
   applying a film of a metal plating solution on said surface of semiconductor material;
   illuminating selected areas of said surface of semiconductor material through said film of metal plating solution; and
   photoelectrochemically depositing oleophilic metal from said plating solution onto said illuminated areas of said surface of semiconductor material to form an image to be printed.

7. The method of claim 6, further comprising the step of removing said film of plating solution from said image roller before printing said image.

8. The method of claim 7, further comprising the step of removing said deposited layer of oleophilic metal from said semiconductor surface of said image roller after printing said image.

9. The method of claim 8, wherein the step of removing said deposited layer of oleophilic metal comprises chemically or electrochemically dissolving said layer of oleophilic metal plating material without dissolving said semiconductor surface of said image roller.

10. The method of claim 9, further comprising repeating said steps of applying a metal plating solution to a printing press image roller having a surface of hydrophilic semiconductor material, illuminating selected areas of said semiconductor surface through said plating solution, photoelectrochemically depositing oleophilic metal on said semiconductor surface to form the image on said image roller, printing the image, and removing said oleophilic metal from said semiconductor surface without removing said image roller from said printing press.

11. The method of claim 9, wherein the steps of providing, applying, and depositing further comprise providing said printing press image roller with a surface of hydrophilic p-type NiO, applying a film of a copper pyrophosphate electrolyte on said NiO surface, and photoelectrochemically depositing a layer of oleophilic copper on said NiO surface in the form of said image.

12. An on-press imaging apparatus for a printing press, comprising:
   an image roller having a surface comprising a substrate material;
   a coating of hydrophilic semiconductor material on said substrate material;
   means for applying a thin film of a metal plating solution on said semiconductor coating;
   a laser generating a beam for illuminating said semiconductor coating through said film of plating solution;

a computer processor for directing said laser beam to trace an image pattern on said semiconductor coating; and means for photoelectrochemically depositing a plating layer of oleophilic metal on said semiconductor coating in the form of said image pattern.

13. The apparatus of claim 12, wherein said substrate comprises Ni, said semiconductor coating comprises p-type NiO, said plating solution comprises a copper pyrophosphate electrolyte, and said layer of deposited oleophilic metal comprises copper.

14. The apparatus of claim 13, further comprising means for removing said deposited layer of oleophilic copper, thereby erasing said image pattern from said semiconductor coating.

15. The apparatus of claim 14, wherein said means for removing said deposited layer of oleophilic copper comprises a solution for chemically or electrochemically dissolving said layer of copper leaving said NiO coating reusable.

* * * * *